(12) United States Patent
Chu et al.

(10) Patent No.: US 7,226,851 B2
(45) Date of Patent: Jun. 5, 2007

(54) METHOD FOR MANUFACTURING SEMICONDUCTOR DEVICE AND NON-VOLATILE MEMORY

(75) Inventors: Chien-Lung Chu, Taipei County (TW); Wei-Chung Tseng, Hsinchu (TW); Saysamone Pittikoun, Hsinchu County (TW); Houng-Chi Wei, Hsinchu (TW)

(73) Assignee: Powchip Semiconductor Corp., Hsinchu (TW)

( * ) Notice: Subject to any disclaimer, the term of this patent is extended or adjusted under 35 U.S.C. 154(b) by 41 days.

(21) Appl. No.: 11/164,134

(22) Filed: Nov. 11, 2005

(65) Prior Publication Data
US 2006/0292850 A1 Dec. 28, 2006

(30) Foreign Application Priority Data
Jun. 27, 2005 (TW) .............................. 94121370 A

(51) Int. Cl.
*H01L 21/3205* (2006.01)
(52) U.S. Cl. .................. 438/587; 438/267; 438/588; 438/666; 257/E27.108; 257/E21.659
(58) Field of Classification Search ................ 438/257, 438/258, 262, 267, 587, 588, 624, 666, FOR. 208; 257/E27.108, E21.659
See application file for complete search history.

(56) References Cited

U.S. PATENT DOCUMENTS
2005/0009312 A1* 1/2005 Butt et al. .................. 438/587

* cited by examiner

*Primary Examiner*—George R. Fourson
*Assistant Examiner*—Julio J. Maldonado
(74) *Attorney, Agent, or Firm*—Jianq Chyun IP Office

(57) ABSTRACT

A method for manufacturing semiconductor device is provided. First, a substrate is provided. Then, a plurality of first gate lines disposed in parallel to each other and a first dummy gate line disposed in a direction perpendicular to the first gate lines are formed on the substrate. There is a first gap between the first dummy gate line and the first gate lines and there is a second gap between every pair of adjacent first gate lines. Thereafter, a second composite layer and a conductive layer are sequentially formed over the substrate. The conductive layer is etched back to form a plurality of second device structures that completely fills the second gaps. Then, the conductive layer in the first gap is removed.

30 Claims, 10 Drawing Sheets

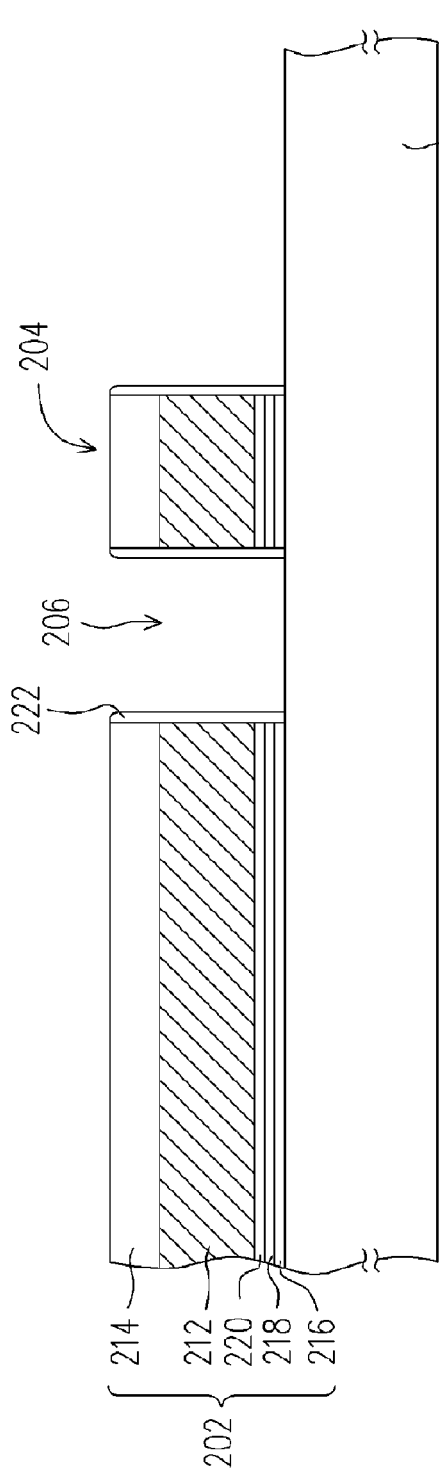
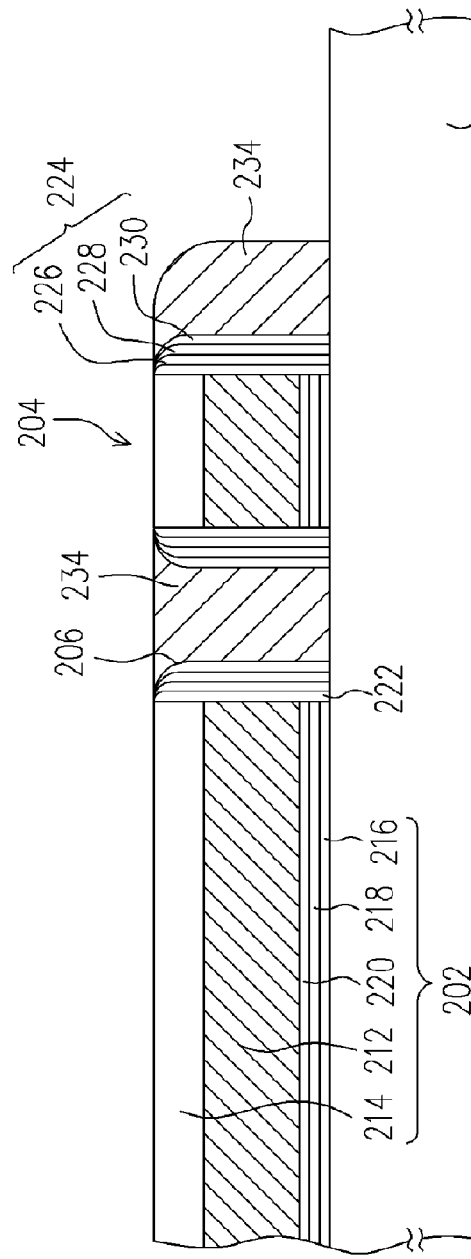

METHOD FOR MANUFACTURING SEMICONDUCTOR DEVICE AND NON-VOLATILE MEMORY

CROSS-REFERENCE TO RELATED APPLICATION

This application claims the priority benefit of Taiwan application serial no. 94121370, filed on Jun. 27, 2005. All disclosure of the Taiwan application is incorporated herein by reference.

BACKGROUND OF THE INVENTION

1. Field of the Invention

The present invention relates to a method for manufacturing semiconductor device. More particularly, the present invention relates to a method for manufacturing semiconductor device and non-volatile memory.

2. Description of the Related Art

Non-volatile memory is a type of memory that has the capacity to retain stored data even after power to the device is removed. Because non-volatile memory products such as flash memory and nitride read-only-memory (NROM) allow multiple data entry, reading and erasing operations, these memory devices have been broadly applied in personal computer and electronic equipment.

FIG. 1A is a top view of a conventional non-volatile memory. FIG. 1B is a schematic cross-sectional view along line I–I' (the X direction) of FIG. 1A and FIG. 1C is a schematic cross-sectional view along line II–II' (the Y direction) of FIG. 1A. The conventional method of fabricating the non-volatile memory includes providing a substrate 100 and then forming a plurality of gate lines 102 on the substrate 100 with spacers 104 on their respective sidewalls. Each gate line 102 includes a dielectric layer 103, a gate 105 and a cap layer 107. Then, a dielectric layer 106 and a conductive layer (not shown) are sequentially formed over the substrate 100.

Thereafter, a portion of the conductive layer is removed to form a plurality of gates 110 that completely fills the gaps between the gate lines 102. The gates 110 and the gate lines 102 together form memory cell rows 113. Furthermore, conductive spacers (not shown) are also formed on the sidewalls of the outermost gate lines 102. A silicon oxide layer 115 is subsequently formed on the surface of the gate 110. After that, a patterned photoresist layer (not shown) is formed over the substrate 100 and an etching operation is carried out to remove the conductive spacers. Finally, source/drain regions 114 are formed in the substrate 100 on the respective sides of the memory cell rows 113.

However, in the aforementioned process, a silicon oxide layer is formed on the conductive spacers. As a result, the etching operation for removing the conductive spacers can hardly remove all the conductive spacers. The remaining polysilicon residue 116 often leads to a short circuit in the semiconductor device.

SUMMARY OF THE INVENTION

Accordingly, at least one objective of the present invention is to provide a method for fabricating semiconductor device capable of preventing short circuit in the semiconductor device due to the presence of unwanted residual metallic material.

At least a second objective of the present invention is to provide a method for fabricating non-volatile memory capable of eliminating the step of removing a residual conductive layer and hence preventing short circuit in the semiconductor device due to the presence of unwanted residual metallic material.

To achieve these and other advantages and in accordance with the purpose of the invention, as embodied and broadly described herein, the invention provides a method for fabricating semiconductor device. First, a substrate is provided. Then, a plurality of first gate lines disposed in parallel to each other and a first dummy gate line disposed in a direction perpendicular to the first gate lines are formed on the substrate. There is a first gap between the first dummy gate line and the first gate lines and there is a second gap between every pair of adjacent first gate lines. Thereafter, a second composite layer is formed over the substrate. After that, a conductive layer is formed over the second composite layer. The conductive layer is etched back to form a plurality of second device structures that completely fills the second gaps. Finally, the second device structures in the first gap are removed.

According to the method for fabricating semiconductor device in the embodiment of the present invention, the step of removing the second device structures in the first gaps includes forming a patterned photoresist layer over the substrate to expose the first gaps and performing an anisotropic etching process thereafter.

According to the method for fabricating semiconductor device in the embodiment of the present invention, the step of forming the first dummy gate line also includes forming a second dummy gate line disposed in a direction parallel to the first gate line. Furthermore, there is a third gap between the second dummy gate line and the first gate lines.

According to the method for fabricating semiconductor device in the embodiment of the present invention, the step of forming the conductive layer further includes filling the third gaps with conductive material.

According to the method for fabricating semiconductor device in the embodiment of the present invention, the step of removing the conductive layer in the first gaps further includes removing the conductive layer in the third gaps.

According to the method for fabricating semiconductor device in the embodiment of the present invention, the first gate lines and the first dummy gate line each includes a first composite layer, a gate and a cap layer.

According to the method for fabricating semiconductor device in the embodiment of the present invention, the cap layer is fabricated using silicon oxide or silicon nitride, for example.

According to the method for fabricating semiconductor device in the embodiment of the present invention, the first composite layer and the second composite layer each includes a bottom dielectric layer, a charge storage layer and a top dielectric layer.

According to the method for fabricating semiconductor device in the embodiment of the present invention, the bottom dielectric layer and the top dielectric layer are fabricated using silicon oxide, for example.

According to the method for fabricating semiconductor device in the embodiment of the present invention, the charge storage layer is fabricated using silicon nitride or doped polysilicon, for example.

According to the method for fabricating semiconductor device in the embodiment of the present invention, spacers are also formed on the respective sidewalls of the first gate lines and the first dummy line.

According to the method for fabricating semiconductor device in the embodiment of the present invention, the spacers are fabricated using silicon nitride, for example.

According to the method for fabricating semiconductor device in the embodiment of the present invention, the first dummy gate line is formed in a non-device region outside the first gate lines and the second device structures.

The present invention also provides a method for fabricating non-volatile memory. First, a substrate is provided. Then, a plurality of gate lines disposed in parallel to each other and a first dummy gate line disposed in a direction perpendicular to the gate lines are formed on the substrate. There is a first gap between the first dummy gate line and the gate lines and there is a second gap between every pair of adjacent gate lines. The gate lines and the first dummy gate line include a first charge storage layer. Thereafter, a second composite layer is formed over the substrate. After that, a conductive layer is formed over the second composite layer. The conductive layer is etched back to form a plurality of second gates that completely fills the second gaps, thereby forming a memory cell row. Then, the conductive layer in the first gaps is removed. Finally, source/drain regions are formed in the substrate on the respective sides of the memory cell rows.

According to the method for fabricating non-volatile memory in the embodiment of the present invention, the step of removing the conductive layer in the first gaps includes forming a patterned photoresist layer over the substrate to expose the first gaps and performing an anisotropic etching process thereafter.

According to the method for fabricating non-volatile memory in the embodiment of the present invention, the step of forming the first dummy gate line also includes forming a second dummy gate line disposed in a direction parallel to the gate lines. Furthermore, there is a third gap between the second dummy gate line and the gate lines.

According to the method for fabricating non-volatile memory in the embodiment of the present invention, the step of forming the conductive layer further includes filling the third gaps with conductive material.

According to the method for fabricating non-volatile memory in the embodiment of the present invention, the step of removing the conductive layer in the first gaps further includes removing the conductive layer in the third gaps.

According to the method for fabricating non-volatile memory in the embodiment of the present invention, the gate lines each includes a first gate and a cap layer.

According to the method for fabricating non-volatile memory in the embodiment of the present invention, the first charge storage layer is fabricated using doped polysilicon or silicon nitride, for example.

According to the method for fabricating non-volatile memory in the embodiment of the present invention, the layer above and below the first charge storage layer are fabricated using silicon oxide, for example.

According to the method for fabricating non-volatile memory in the embodiment of the present invention, the cap layer is fabricated using silicon oxide or silicon nitride, for example.

According to the method for fabricating non-volatile memory in the embodiment of the present invention, the second composite layer comprises a bottom dielectric layer, a second charge storage layer and a top dielectric layer.

According to the method for fabricating non-volatile memory in the embodiment of the present invention, the bottom dielectric layer and the top dielectric layer are fabricated using silicon oxide, for example.

According to the method for fabricating non-volatile memory in the embodiment of the present invention, the second charge storage layer is fabricated using silicon nitride or doped polysilicon, for example.

According to the method for fabricating non-volatile memory in the embodiment of the present invention, the conductive layer is fabricated using doped polysilicon, for example.

According to the method for fabricating non-volatile memory in the embodiment of the present invention, spacers are also formed on the respective sidewalls of the gate lines and the dummy gate lines.

According to the method for fabricating non-volatile memory in the embodiment of the present invention, the spacers are fabricated using silicon nitride, for example.

According to the method for fabricating non-volatile memory in the embodiment of the present invention, the first dummy gate line is formed in a non-device region outside the gate lines and the second gates.

In the present invention, dummy gate lines having a structure similar to the first gate lines are formed around the first gate lines when the first gate lines are formed. Therefore, the first gate lines are isolated from each other through the dummy gate lines. Thus, after forming the second device structures and completing the fabrication of the semiconductor device, the conductive layer between the dummy gate line and the conductive layer can be removed so that the residual conductive layer are retained on the sidewalls of the dummy gate line. As a result, the step needed to remove residual conductive layer is eliminated. In addition, short circuit in the semiconductor device caused by an incomplete removal of residual conductive layer is also prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 3A through 3D are schematic cross-sectional views along line I–I' (the X direction) of FIG. 2 showing the steps for fabricating the semiconductor device according to the present invention.

DESCRIPTION OF THE PREFERRED EMBODIMENTS

Figure 1A:
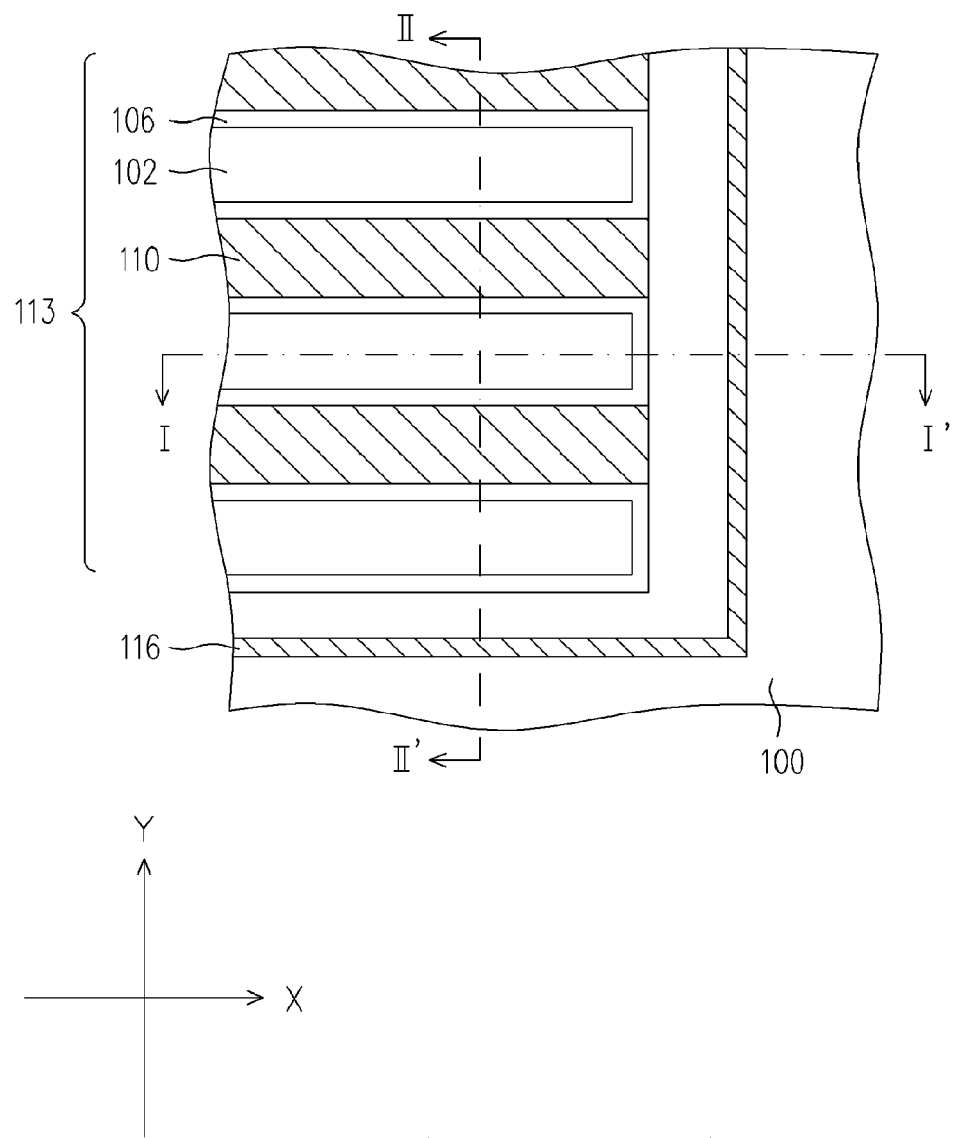
FIG. 1A is a top view of a conventional non-volatile memory.
Figure 1B:
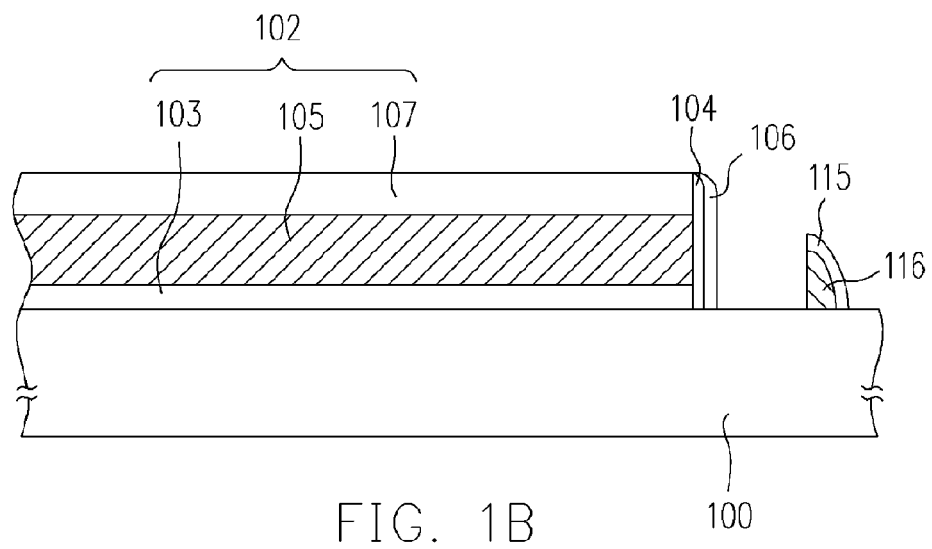
FIG. 1B is a schematic cross-sectional view along line I–I' (the X direction) of FIG. 1A.
Figure 1C:
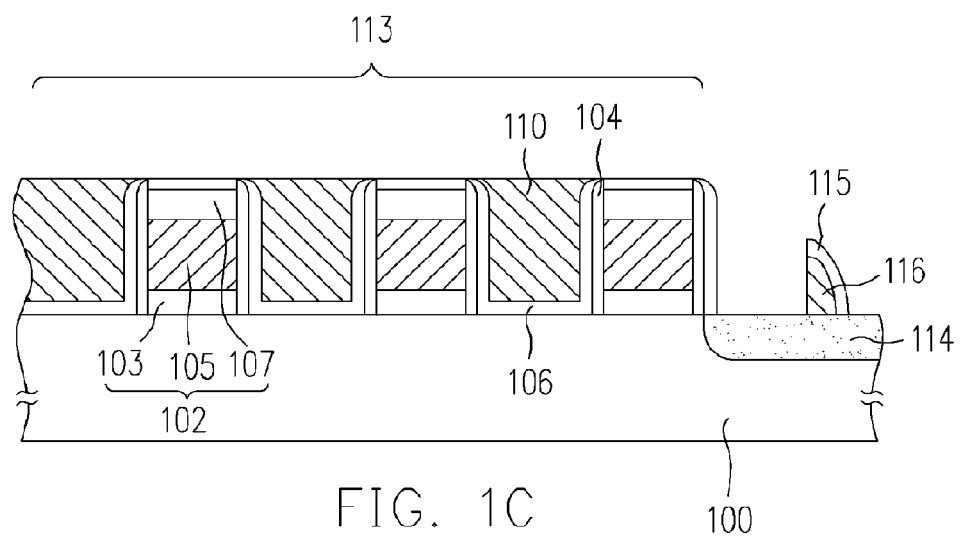
FIG. 1C is a schematic cross-sectional view along line II–II' (the Y direction) of FIG. 1A.

Reference will now be made in detail to the present preferred embodiments of the invention, examples of which are illustrated in the accompanying drawings. Wherever possible, the same reference numbers are used in the drawings and the description to refer to the same or like parts.

In the following, the method of fabricating a semiconductor device is explained using a non-volatile memory as an example.

Figure 2:
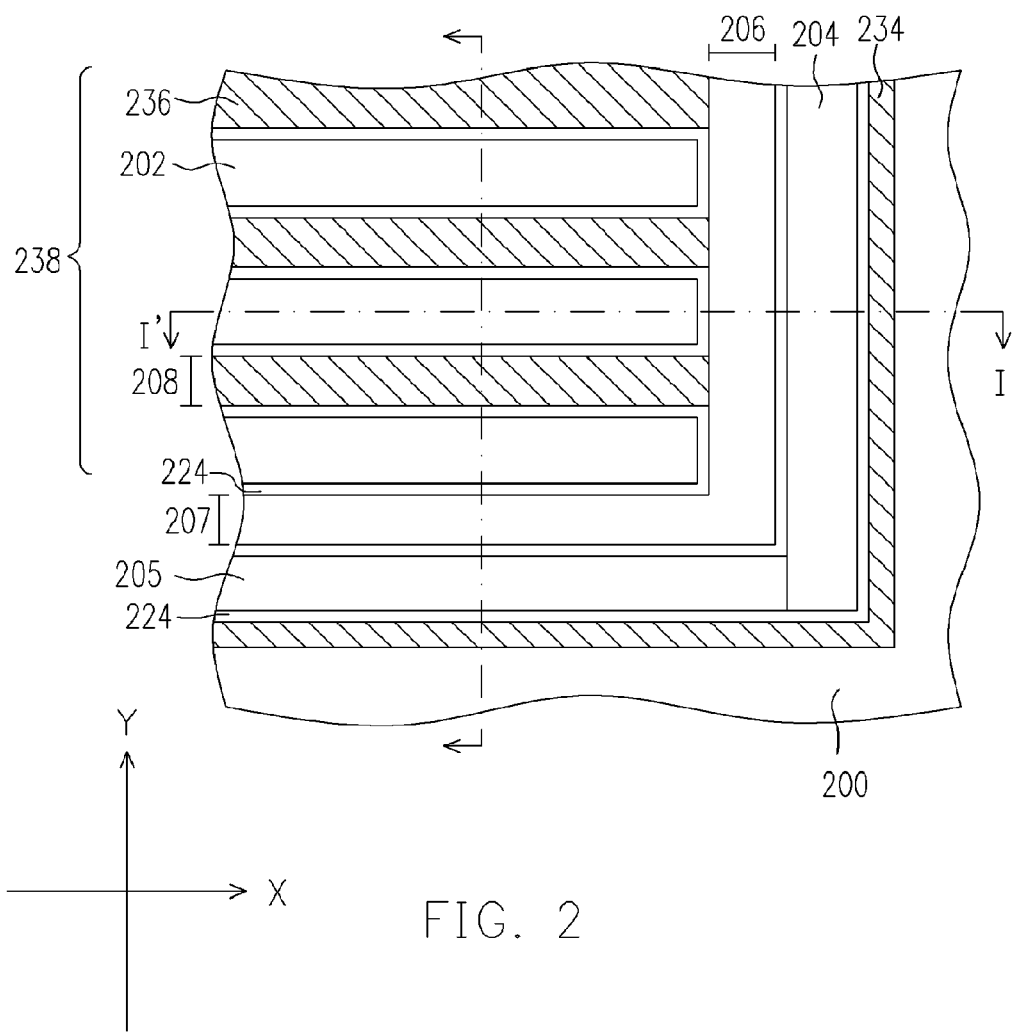
FIG. 2 is a top view of a semiconductor device according to one embodiment of the present invention.
Figure 3C:
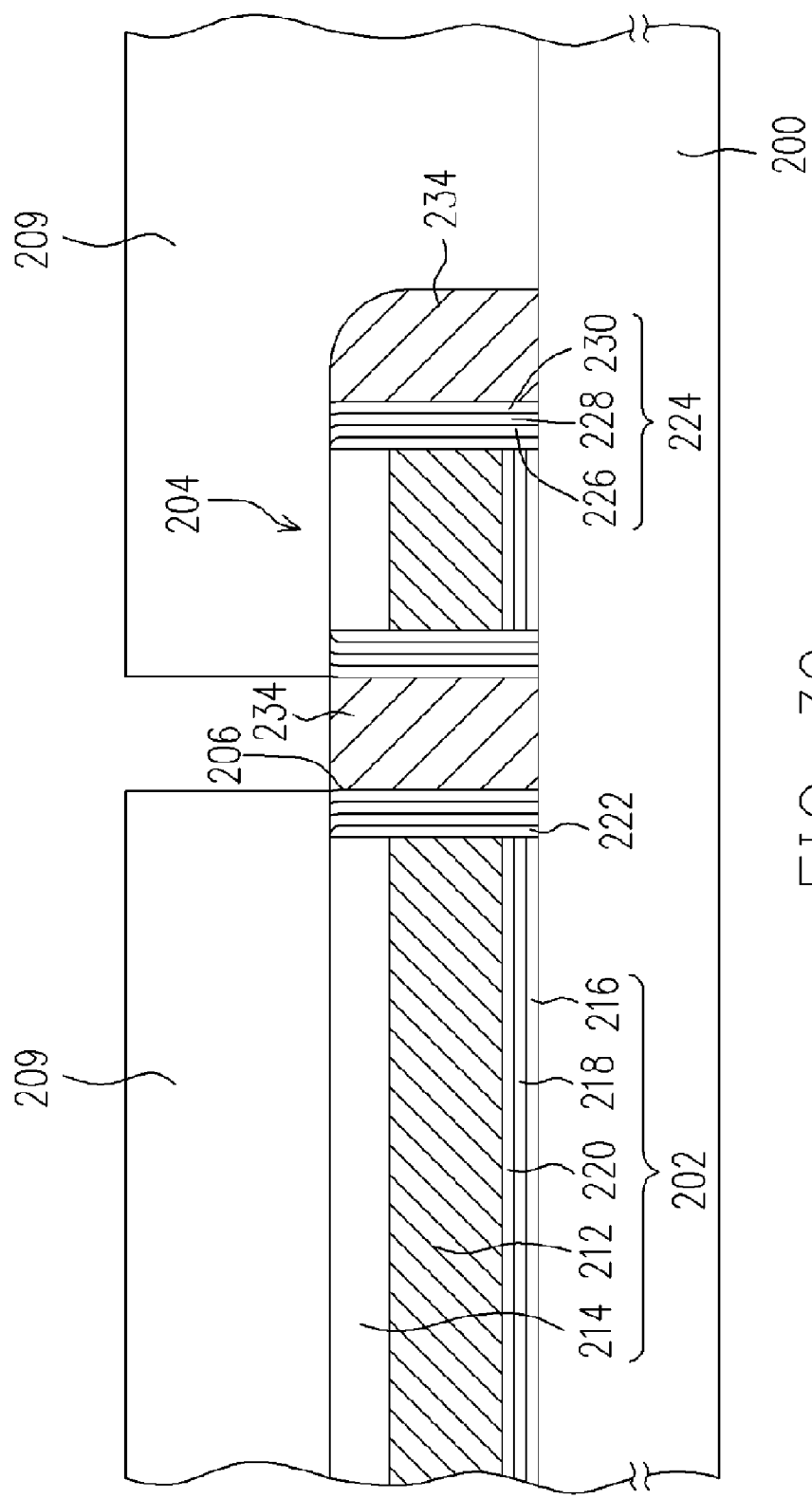
Figure 3D:
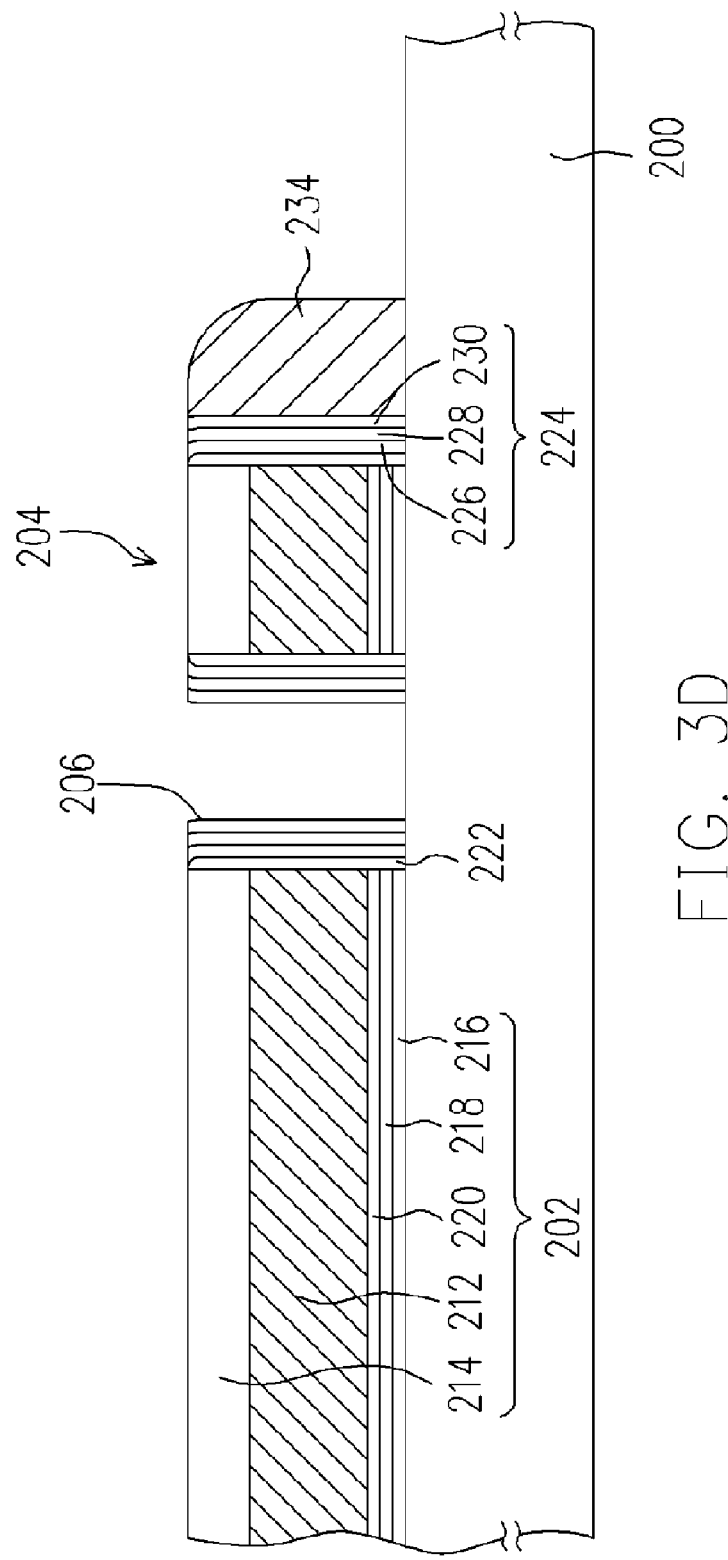
Figure 4A:
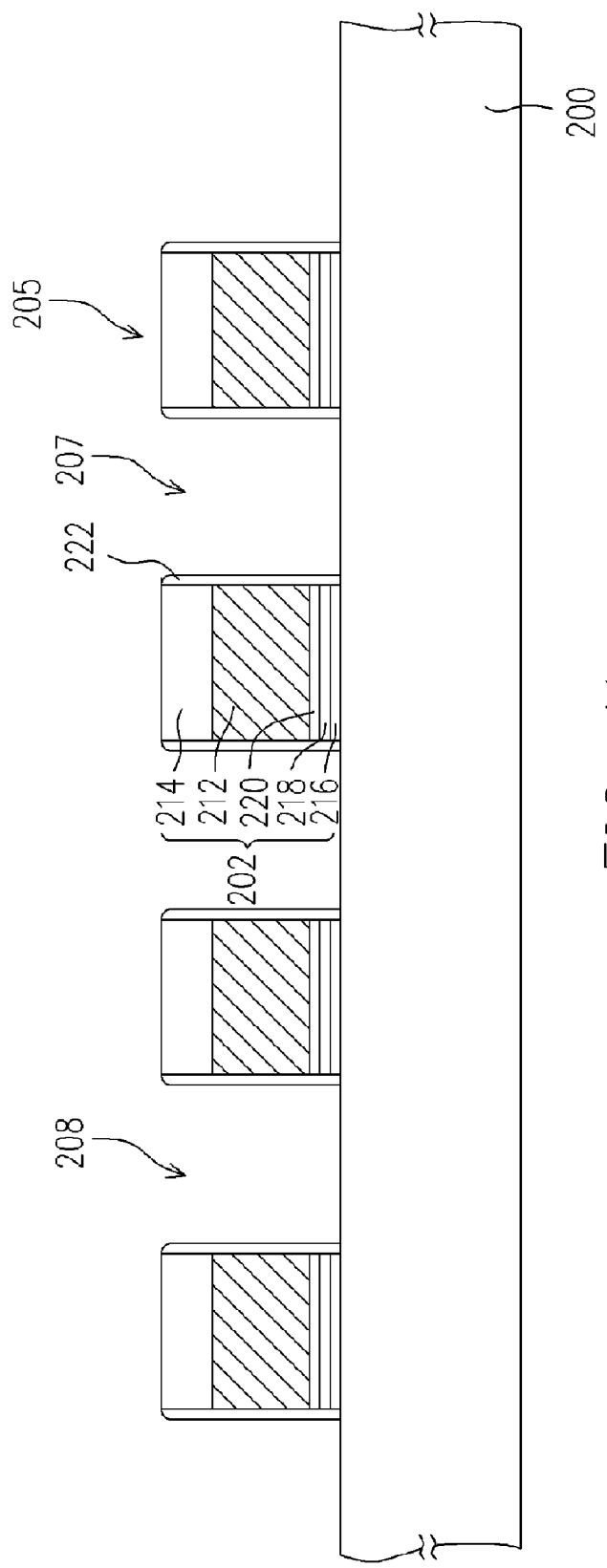
FIGS. 4A through 4D are schematic cross-sectional views along line II–II' (the Y direction) of FIG. 2 showing the steps for fabricating the semiconductor device according to the present invention.

FIG. 2 is a top view of a non-volatile memory device according to one embodiment of the present invention. FIGS. 3A through 3D are schematic cross-sectional views along line I–I' (the X direction) of FIG. 2 showing the steps for fabricating the semiconductor device according to the present invention. FIGS. 4A through 4D are schematic cross-sectional views along line II–II' (the Y direction) of FIG. 2 showing the steps for fabricating the semiconductor device according to the present invention. First, as shown in FIGS. 2, 3A and 4A, a substrate 200 such as a silicon substrate is provided. Then, a plurality of gate lines 202 disposed in parallel to each other and a dummy gate line 204 disposed in a direction perpendicular to the gate lines 202 are simultaneously formed over the substrate 200. Furthermore, there is a gap 206 between the dummy gate 204 and the gate lines 202 and there is a gap 208 between every pair of adjacent gate lines 202. The gate lines 202 and the dummy gate line 204 each includes a charge storage layer 218, a gate 212 and a cap layer 214. The charge storage layer 218, the gate 212 and the cap layer 214 are formed, for example, by sequentially depositing charge storage material, conductive material and insulating material over the substrate 200 to form a charge storage material layer, a conductive material layer and an insulating material layer. Then, the charge storage material layer, the conductive material layer and the insulating material layer are patterned in photolithographic and etching processes.

The charge storage layer 218 is fabricated using doped polysilicon or silicon nitride and the material layer above and below the charge storage layer 218 is fabricated using silicon oxide, for example. The film layer lying immediately above the charge storage layer 218 is called a top dielectric layer 220 and the film layer lying immediately below the charge storage layer 218 is called a bottom dielectric layer 216. The top dielectric layer 220, the charge storage layer 218 and the bottom dielectric layer 216 together constitute a composite layer. The gate 212 is fabricated using polysilicon, for example. The cap layer 214 is fabricated using silicon oxide or silicon nitride, for example.

Furthermore, another dummy gate line 205 disposed in a direction parallel to the gate lines 202 can also be formed simultaneously with the dummy gate line 204. There is a gap 207 between the dummy gate line 205 and the outermost gate line 202. The dummy gate line 205 has constituents identical to the dummy gate line 204. Moreover, the dummy gate lines 205 and 204 are disposed in a non-device region outside the gate lines 202 and are not used for any particular function. In addition, spacers 222 may also be formed on the respective sidewalls of the stacked gate lines 202 and the dummy stacked gate lines 204 and 205. The spacers 222 are fabricated using silicon nitride, for example.

Figure 4B:
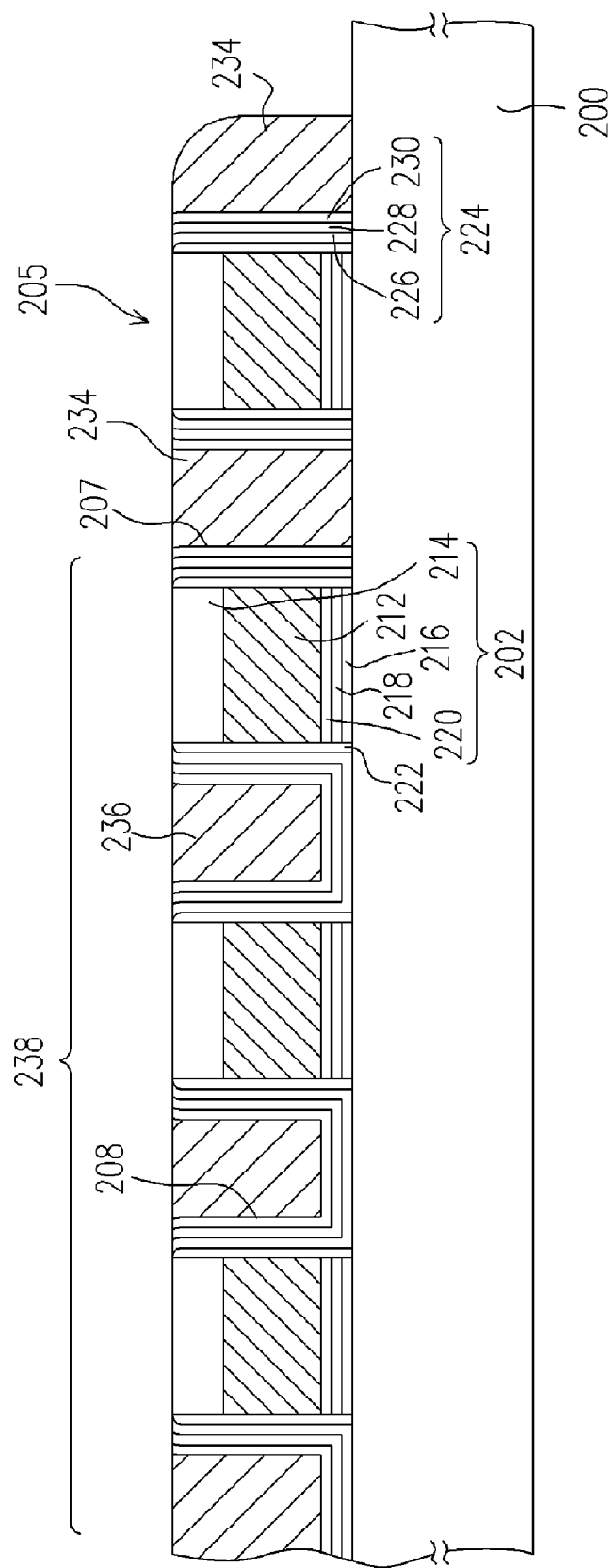

As shown in FIGS. 2, 3B and 4B, a composite layer 224 is formed over the substrate 200. The composite layer 224 includes, for example, a bottom dielectric layer 226, a charge storage layer 228 and a top dielectric layer 230. The bottom dielectric layer 226 is fabricated using silicon oxide and formed by performing a thermal oxidation process, for example. The charge storage layer 228 is fabricated using silicon nitride and formed by performing a chemical vapor deposition process, for example. The top dielectric layer is fabricated using silicon oxide and formed by performing a chemical vapor deposition process, for example. Then, a conductive layer 234 is formed over the substrate 200. The conductive layer 234 is fabricated using doped polysilicon, for example. Thereafter, a portion of the conductive layer 234 is etched back until the gate lines 202 are exposed so that gates 236 completely filling the gaps 208 are formed. The gate 236 connects the gate lines 202 serially together to form memory cell rows 238. The method for removing a portion of the conductive layer 234 includes performing an etching back operation, for example.

Figure 4C:
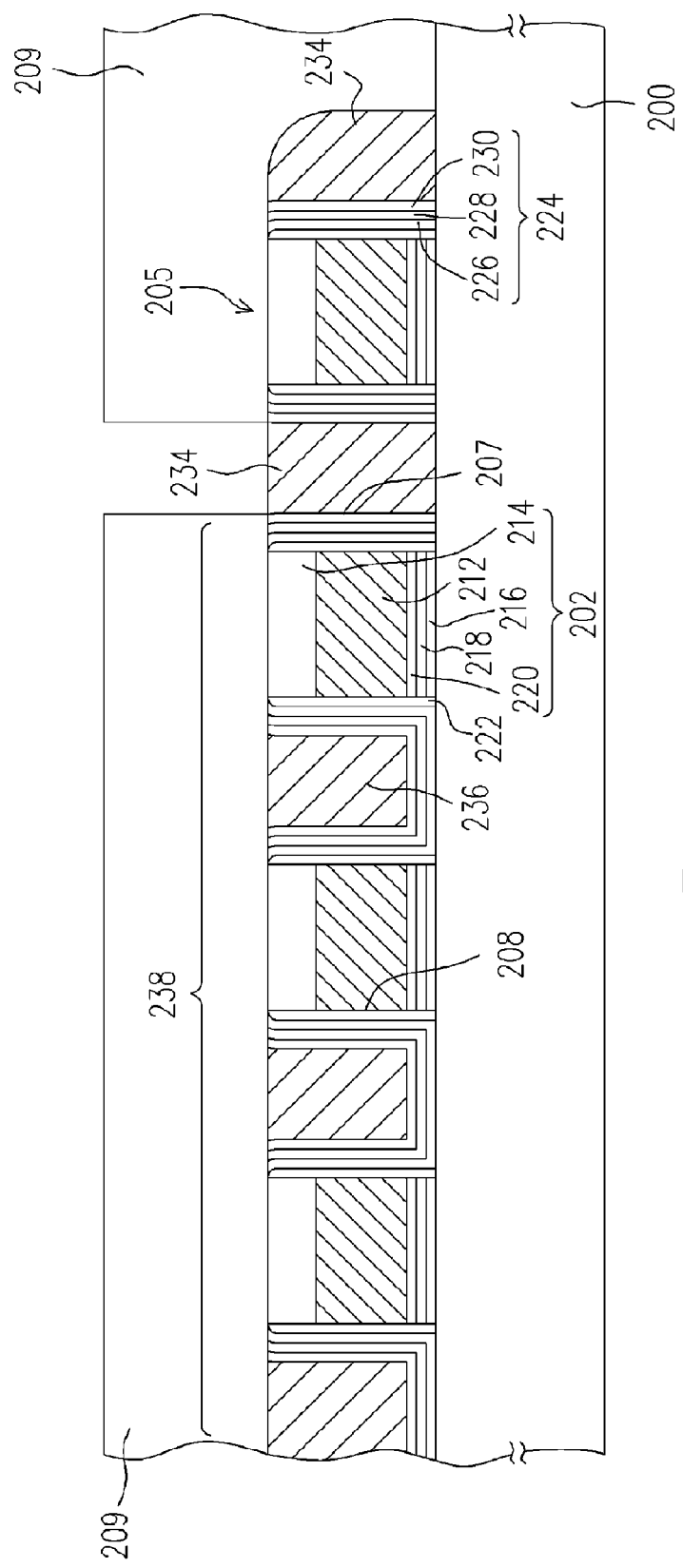
Figure 4D:
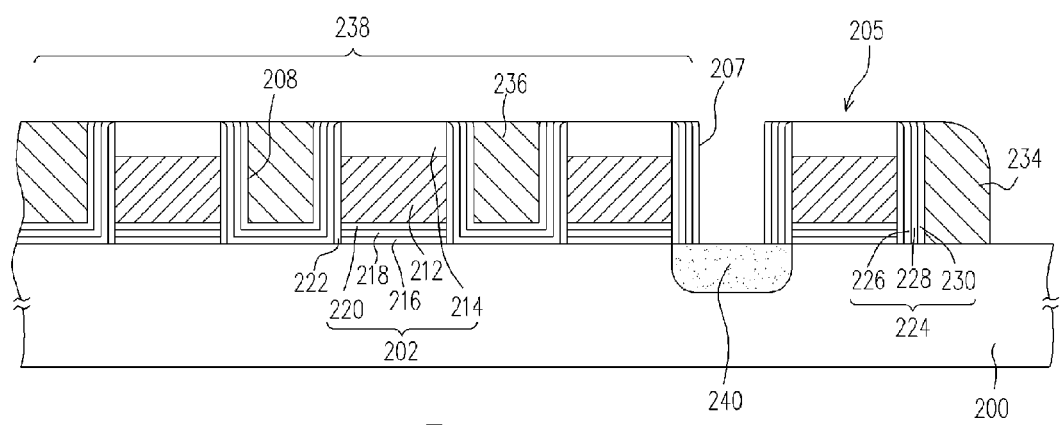

As shown in FIGS. 2, 3C and 4C, a patterned photoresist layer 208 is formed over the substrate 200. Then, as shown in FIGS. 2, 3D and 4D, the conductive layer 234 in the gaps 206 and the gaps 208 are removed. The method of removing the conductive layer 234 includes performing an anisotropic etching process, for example. Thereafter, the patterned photoresist layer 209 is removed and a source/drain region 240 is formed in the substrate 200 on the respective sides of the memory cell rows 238.

In summary, dummy gate lines 204 and 205 having a structure similar to the gate lines 202 are formed around the gate lines 202 when the gate lines 202 are formed. Therefore, after connecting the gate lines 202 serially together through the gates 236 to form the memory cell rows 238, the conductive layer 234 between the dummy gate lines 204, 205 and the memory cell rows 238 can be removed. The memory cell rows 238 are isolated from each other through the dummy gate lines 204 and 205 and the dummy gate lines 204 and 205 are disposed in the non-device region outside the memory cell rows 238. Furthermore, the residual conductive layer 234 is retained on the sidewalls of the dummy gate lines 204 and 205. As a result, short circuit in the semiconductor device caused by the incomplete removal of residual conductive layer 234 is prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating semiconductor device, comprising:

providing a substrate;

forming a plurality of first gate lines disposed in parallel to each other and a first dummy line disposed in a direction perpendicular to the first gate lines, wherein first gaps are formed between the first dummy gate line and the first gate lines and second gaps are formed between every pair of adjacent first gate lines;

forming a second composite layer over the substrate;

forming a conductive layer over the second composite layer;

etching back the conductive layer to form a plurality of second device structures that completely fills the first gaps and the second gaps; and removing the second device structures in the first gaps.

2. The method of claim 1, wherein the step of removing the second device structure in the first gaps includes:

forming a patterned photoresist layer over the substrate to expose the first gaps; and performing an anisotropic etching process.

3. The method of claim 1, wherein a second dummy gate line disposed in parallel to the first gate lines is also formed together with the first dummy gate line, and there is a third gap between the second dummy gate line and a outermost first gate line.

4. The method of claim 3, wherein the conductive layer also fills the third gap when the conductive layer is formed.

5. The method of claim 4, wherein the conductive layer in the third gap is also removed when the conductive layer in the first gaps is removed.

6. The method of claim 1, wherein the first gate lines and the first dummy gate line each comprises a first composite layer, a gate and a cap layer.

7. The method of claim 6, wherein a material constituting the cap layer includes silicon oxide or silicon nitride.

8. The method of claim 6, wherein the first composite layer and the second composite layer each comprises a bottom dielectric layer, a charge storage layer and a top dielectric layer.

9. The method of claim 8, wherein a material constituting the bottom dielectric layer and the top dielectric layer comprises silicon oxide.

10. The method of claim 8, wherein a material constituting the charge storage layer comprises silicon nitride or doped polysilicon.

11. The method of claim 1, wherein a material constituting the conductive layer comprises doped polysilicon.

12. The method of claim 1, wherein spacers are also formed on respective sidewalls of the first gate lines and the dummy gate lines.

13. The method of claim 12, wherein a material constituting the spacers comprises silicon nitride.

14. The method of claim 1, wherein the first dummy gate line is formed in a non-device region outside the first gate lines and the second device structures.

15. A method for fabricating non-volatile memory, comprising the steps of:
   providing a substrate;
   forming a plurality of first gate lines disposed in parallel to each other and a first dummy gate line disposed in a direction perpendicular to the first gate lines, wherein first gaps are formed between the first dummy gate line and the first gate lines and second gaps are formed between every pair of the adjacent first gate lines, and the first gate lines and the first dummy gate line each comprises a first charge storage layer;
   forming a second composite layer over the substrate;
   forming a conductive layer over the substrate;
   etching back the conductive layer to form a plurality of second gates that completely fills the second gaps, thereby forming a memory cell row;
   removing the conductive layer in the first gaps; and
   forming a source/drain region in the substrate on respective sides of the memory cell row.

16. The method of claim 15, wherein the step for removing the conductive layer in the first gaps includes:
   forming a patterned photoresist layer over the substrate; and
   performing an anisotropic process.

17. The method of claim 15, wherein a second dummy gate line disposed in parallel to the first gate lines is also formed together with the first dummy gate line, and a third gap is also formed between the second dummy gate line and the outermost first gate line.

18. The method of claim 17, wherein the conductive layer also fills the third gap when the conductive layer is formed.

19. The method of claim 18, wherein the conductive layer in the third gap is also removed when the conductive layer in the first gaps is removed.

20. The method of claim 15, wherein each first gate line further comprises a first gate and a cap layer.

21. The method of claim 20, wherein a material constituting the cap layer comprises silicon oxide or silicon nitride.

22. The method of claim 15, wherein a material constituting the first charge storage layer comprises doped polysilicon or silicon nitride.

23. The method of claim 15, wherein a material constituting the film layers above and below the first charge storage layer comprises silicon oxide.

24. The method of claim 15, wherein the second composite layer comprises a bottom dielectric layer, a second charge storage layer and a top dielectric layer.

25. The method of claim 24, wherein a material constituting the bottom dielectric layer and the top dielectric layer comprises silicon oxide.

26. The method of claim 24, wherein a material constituting the second charge storage layer comprises silicon nitride or doped polysilicon.

27. The method of claim 15, wherein a material constituting the conductive layer comprises polysilicon.

28. The method of claim 15, wherein spacers are also formed on respective sidewalls of the first gate lines and the first dummy gate line.

29. The method of claim 28, wherein a material constituting the spacers comprises silicon nitride.

30. The method of claim 15, wherein the first dummy gate line is formed in a non-device region outside the first gate lines and the second gates.

* * * * *